(12) United States Patent
Lucas

(10) Patent No.: US 11,788,559 B2
(45) Date of Patent: Oct. 17, 2023

(54) HIGH PERFORMANCE CANTILEVER FAN

(71) Applicant: Perpetua, Inc., Liberty Lake, WA (US)

(72) Inventor: Timothy S. Lucas, Liberty Lake, WA (US)

(73) Assignee: NeoFan, Inc., Richmond, VA (US)

( * ) Notice: Subject to any disclaimer, the term of this patent is extended or adjusted under 35 U.S.C. 154(b) by 1001 days.

(21) Appl. No.: 16/474,539

(22) PCT Filed: Dec. 20, 2017

(86) PCT No.: PCT/US2017/067658
§ 371 (c)(1),
(2) Date: Jun. 27, 2019

(87) PCT Pub. No.: WO2018/125719
PCT Pub. Date: Jul. 5, 2018

(65) Prior Publication Data
US 2020/0025217 A1 Jan. 23, 2020

Related U.S. Application Data

(60) Provisional application No. 62/439,452, filed on Dec. 27, 2016, provisional application No. 62/463,330, filed on Feb. 24, 2017.

(51) Int. Cl.
*B63H 1/26* (2006.01)
*F04D 33/00* (2006.01)
(Continued)

(52) U.S. Cl.
CPC ............. *F04D 33/00* (2013.01); *H02K 33/18* (2013.01); *H05K 7/20* (2013.01); *H10N 30/2042* (2023.02); *H10N 30/2045* (2023.02)

(58) Field of Classification Search
CPC ... F04D 33/00; H01L 41/094; H05K 7/20172; F28D 11/06; H01F 7/14; H02K 33/12
(Continued)

(56) References Cited

U.S. PATENT DOCUMENTS 3,706,018 A * 12/1972 Morris ................... H02K 33/00
  318/132
4,063,826 A 12/1977 Riepe
(Continued)

FOREIGN PATENT DOCUMENTS

| CN | 105471318 A | 4/2016 |
| EP | 2 743 513 A1 | 6/2014 |
| WO | 95/16137 A1 | 6/1995 |

OTHER PUBLICATIONS

Supplementary European Search Report dated Jun. 26, 2020 issued in related European Patent Application No. 17 88 9202.
(Continued)

*Primary Examiner* — Long T Tran
*Assistant Examiner* — James J Kim
(74) *Attorney, Agent, or Firm* — Gordon Rees Scully

(57) ABSTRACT

A cantilever fan including a blade and a blade permanent magnet. The blade is clamped at one end to a base and has a distal end which is free to oscillate with distal end having the largest swept displacement of any portion of the blade. The blade extends from the clamped end to the distal end. The blade permanent magnet is attached only to the blade at a point along the blade's length and is free to move with the blade. The fan includes a stationary permanent magnet attached only to the base. The respective locations and relative orientation of the blade permanent magnet and stationary magnet result in a repulsive magnetic force between the blade permanent magnet and stationary magnet. The fan is configured so that the repulsive force increases as the blade's deflection brings the blade permanent magnet closer to the stationary magnet.

20 Claims, 13 Drawing Sheets

(51) Int. Cl.
*H02K 33/18* (2006.01)
*H05K 7/20* (2006.01)
*H10N 30/20* (2023.01)

(58) Field of Classification Search
USPC .......................................................... 416/238
See application file for complete search history.

(56) References Cited

U.S. PATENT DOCUMENTS

| | | | | | |
|---|---|---|---|---|---|
| 4,780,062 | A | * | 10/1988 | Yamada | F04D 33/00 417/410.2 |
| 5,045,637 | A | * | 9/1991 | Sato | B32B 15/011 174/391 |
| 7,619,894 | B2 | * | 11/2009 | Wang | F04D 29/582 165/122 |
| 9,510,480 | B2 | * | 11/2016 | Zhang | H05K 7/20172 |
| 9,572,281 | B2 | * | 2/2017 | Roebke | H05K 7/20209 |
| 10,768,738 | B1 | * | 9/2020 | Zhang | G06F 3/016 |
| 2008/0286133 | A1 | * | 11/2008 | He | F04B 35/04 417/415 |
| 2009/0213555 | A1 | * | 8/2009 | Wang | F04D 33/00 361/690 |
| 2013/0183154 | A1 | | 7/2013 | Lucas | |
| 2013/0342057 | A1 | | 12/2013 | Fried | |
| 2014/0166260 | A1 | | 6/2014 | Roebke | |
| 2019/0301442 | A1 | * | 10/2019 | Hao | H05K 7/20154 |

OTHER PUBLICATIONS

International Search Report and Written Opinion dated Feb. 23, 2018 issued in International Application No. PCT/US2017/067658 filed Dec. 20, 2017.
Wikipedia "Electropermanent Magnet" Nov. 19, 2016; 5 pages.

* cited by examiner

HIGH PERFORMANCE CANTILEVER FAN

CROSS REFERENCE TO RELATED PATENT APPLICATIONS

This application claims priority to and the benefit of the following U.S. Provisional Patent Applications: Application Ser. No. 62/439,452 filed Dec. 27, 2016 and Application Ser. No. 62/463,330 filed Feb. 24, 2017. The two foregoing applications are incorporated by reference herein in their entireties.

BACKGROUND

This application relates generally to air fan technology for thermal management and general purpose fan applications.

Rotary fans used for air heat transfer provide the most prevalent active cooling solution in thermal management. Increased power density in electronics products places ongoing pressure on rotary fan technology to improve flow and pressure performance while also increasing life and reliability. Delivering significant extensions in fan life has proven to be the most difficult industry challenge and little progress has been made. Emerging products such as HBLED lamps and telecom need fan life times up to 20 years but the bearings used in rotary fans typically provide no more than 7 years of L10 life, which means that 10% of these fans have failed after 7 years.

Since cantilever fans move air via a bending oscillating blade, they do not require bearings and thus offer the potential for more than 20 years of life. So called "infinite life" can be achieved for the oscillating cantilever blade made from a ferrous metal if the bending stress is less than the material's fatigue limit. Unfortunately, designing cantilever blades with infinite life requires sacrificing pressure and flow performance, resulting in cantilever fans that offer only a fraction of the flow and pressure performance of a similarly sized rotary fan. Conversely, for cantilever fans to achieve commercially relevant flow and pressure performance requires sacrificing life and reliability. In fact for conventional cantilever fans to achieve performance and size comparable to rotary fans, will result in fan failure in a matter of days or sometimes hours. This poor performance vs. life tradeoff is imposed by the intrinsic material properties of even the best available materials. These physical material limitations are explained in more detail as follows.

Cantilever fans are operated by necessity at their mass-spring mechanical resonance frequency, referred to herein as $f_o$. Otherwise cantilever fan power consumption will increase significantly as the drive frequency is varied away from $f_o$. In conventional cantilever fans, the mass and spring that fully determine $f_o$ are exclusive properties of the oscillating blade and comprise the effective oscillating mass of the blade and the bending spring stiffness K of the blade. In order to provide commercially relevant performance, cantilever fans must deliver relevant pressure and flow performance while being no larger than rotary fans providing the same pressure and flow performance. Consequently, a competitive cantilever fan must use blades that are very short compared to conventional cantilever fan blade lengths. Nevertheless, these short blades must provide large strokes to deliver competitive air flow rates and this significantly increases the blade's bending stress, since the bending stress for a fixed blade stroke increases inversely with blade length. Further, to deliver the required pressure and flow performance, these short blades must run at frequencies that are comparable to the blade pass frequencies of rotating fans. For example, a rotary fan with 6 blades running at only 3,000 RPM, would have a blade pass frequency of 300 Hz. Compared to the rotary fan that has 6 blade passes per revolution, a cantilever blade has the disadvantage of having only 2 blade passes per cycle. Consequently, a single cantilever blade having a blade area comparable to the total rotary fan blade area, would need to run at 150 Hz to provide similar flow rates.

To reach these higher frequencies the cantilever blade $f_o$ must increase far beyond that of conventional cantilever fans and to increase performance these higher frequencies must be achieved without reducing the blade's deflection amplitude or stroke. This increase in $f_o$ requires that the stiffness of the cantilever blade must increase, which for conventional cantilever fans is accomplished by increasing the thickness of the blade material or reducing the blade length. But for a given blade deflection, stress increases with material thickness and with the inverse of blade length, and for steels with the best possible material properties, a stiffness large enough to reach the required $f_o$ will result in bending stresses that exceed the material's fatigue limit. Consequently, at blade stroke amplitude and $f_o$ values needed to provide commercially relevant air performance in the proper fan size, the cantilever blades will fail due to crack propagation after only hours of operation.

Ferrous materials can provide "infinite life" since they possess a fatigue limit (aka endurance limit). But even the steels with the best combination of physical properties will fail at the stress levels required to match the air performance of rotary fans in the required fan size. Given that these requirements are beyond the limits of any known materials, conventional cantilever fans have failed to deliver on their promise of extended fan life at the required air performance and fan size. Consequently the industry's need for significantly extended fan life, without loss of air performance, remains unmet.

BRIEF DESCRIPTION OF THE DRAWINGS

The accompanying drawings, which are incorporated in and form a part of the specification, illustrate the various disclosed embodiments and, together with the description, serve to explain the principles of the invention. In the drawings.

DETAILED DESCRIPTION

To satisfy the current unmet market need for extend fan life, the present invention provides a new cantilever fan system that enables the higher operating frequencies and blade strokes necessary to achieve commercially relevant air flow rates and air pressures in small fan form factors, while at the same time reducing peak blade bending stresses to below the material's fatigue limit, thereby increasing cantilever fan life and reliability far beyond that of current rotary fans using lubricated bearings.

Magnetic Springs

Conventional cantilever fans operate at the mass-spring resonance frequency of the cantilever blade in order to avoid the excessive power consumption associated with operation at other frequencies. As discussed previously, the spring stiffness K that determines the resonant frequency $f_o$ is an intrinsic property of the blade. For ferrous metals, so called "infinite life" is provided when the peak bending stress of the blade is below the material's fatigue limit, but to reach commercially relevant air performance in the requisite fan sizes requires much higher $f_o$ values and therefore much higher blade stiffness K. However, these higher K values result in peak bending stresses that exceed the material's fatigue limit resulting in only hours or less of blade life. Since this commercial viability barrier is imposed by the intrinsic material properties of the blade, conventional cantilever fans have been unable to achieve the significant fan life extension sought by the industry.

To solve this problem the present invention does not depend on the blade to provide the large required spring stiffness K needed to reach the higher $f_o$ range. Instead, the present invention uses permanent magnets to provide the large spring K needed to reach the required $f_o$ range. As discussed previously, conventional cantilever fans depend solely on the blade's spring K, in which case K and bending stress are intrinsically coupled, such that increasing the blade's stiffness K will cause unacceptable increases in the blade's stress. The magnets of the present invention provide a spring K that is decoupled from the blade's bending stress. This decoupling of K and blade stress enables the use of thinner blade materials that maintain blade bending stresses below the fatigue limit. In this way, the present invention provides a cantilever fan with commercially relevant air performance and fan size with infinite blade life, thereby delivering the 20 year, or greater, fan life sought by the industry.

Figure 1:
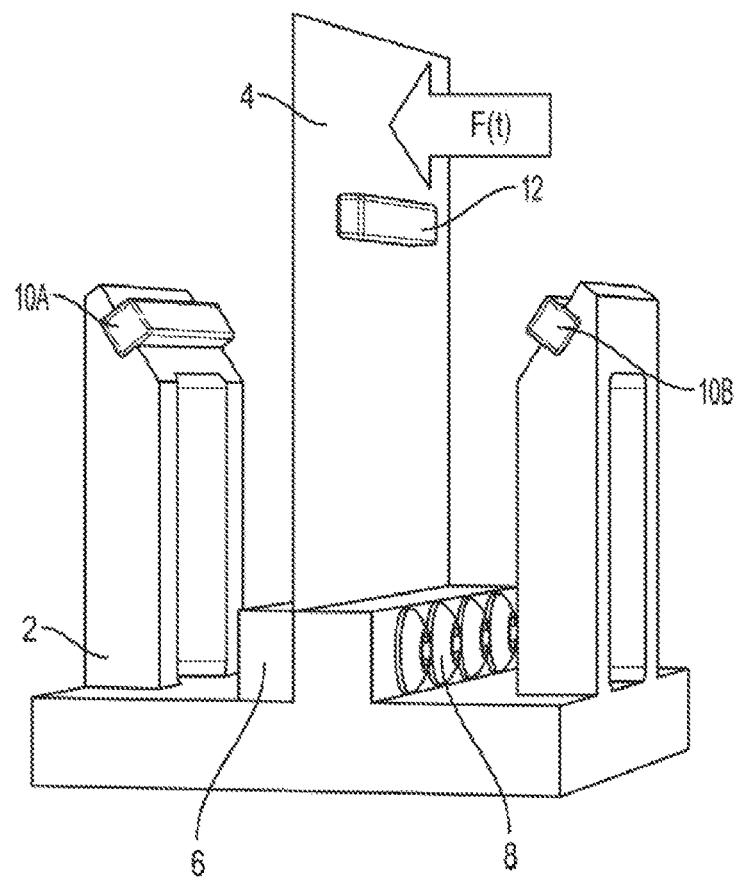
FIG. 1 provides an embodiment of the present invention showing a cantilever fan having magnetic springs.
Figure 2:
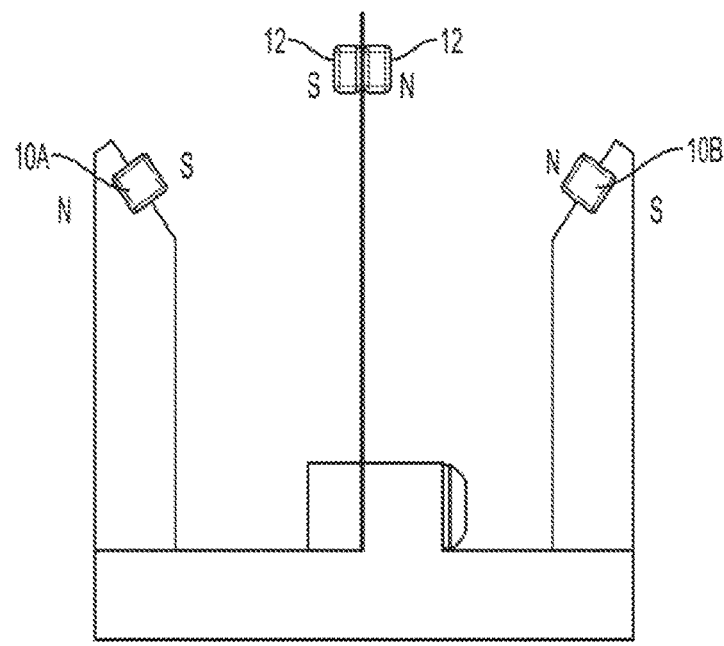
FIG. 2 illustrates the magnetic polarity of the permanent magnets of FIG. 1.
Figure 18:
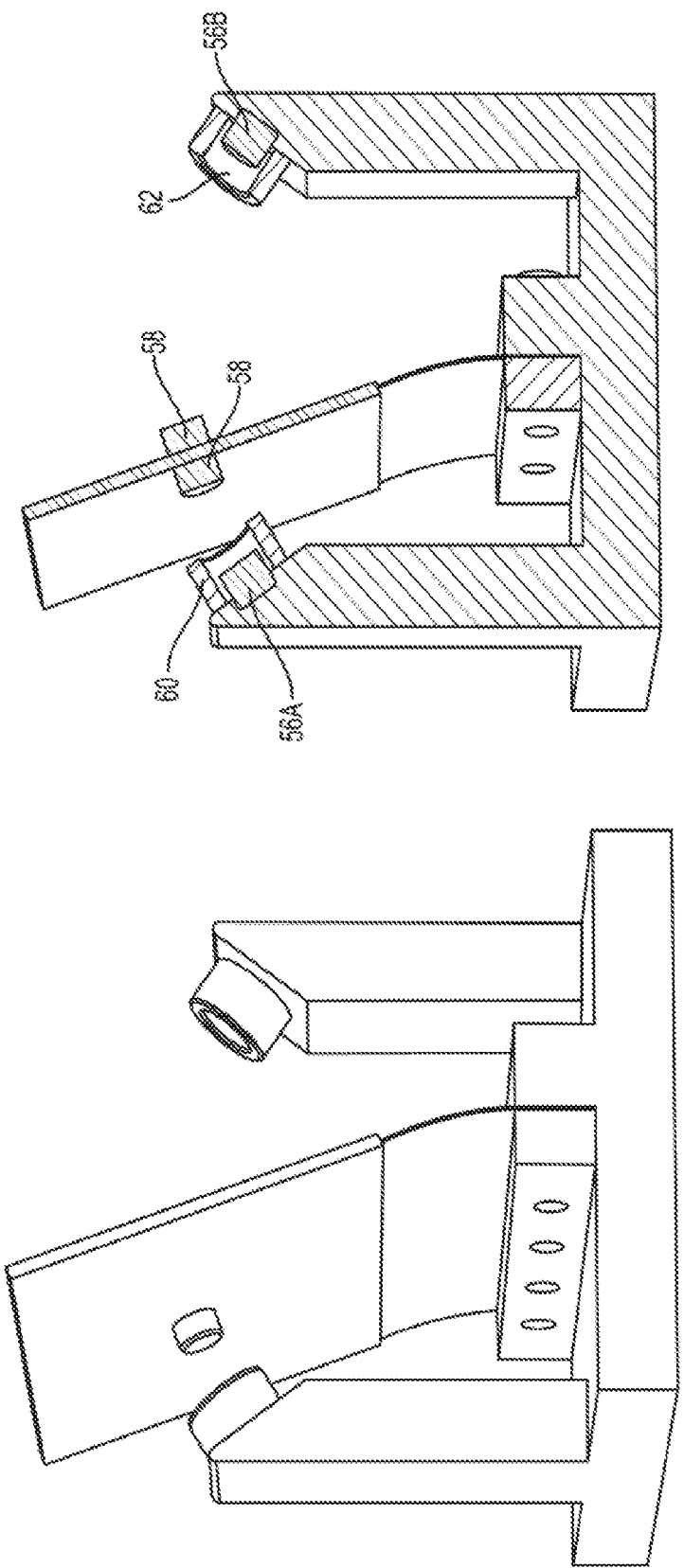
FIG. 18 shows one of many different magnet shapes that can be used for the magnetic springs of the present invention, where the magnets have a cylindrical shape.
Figure 19:
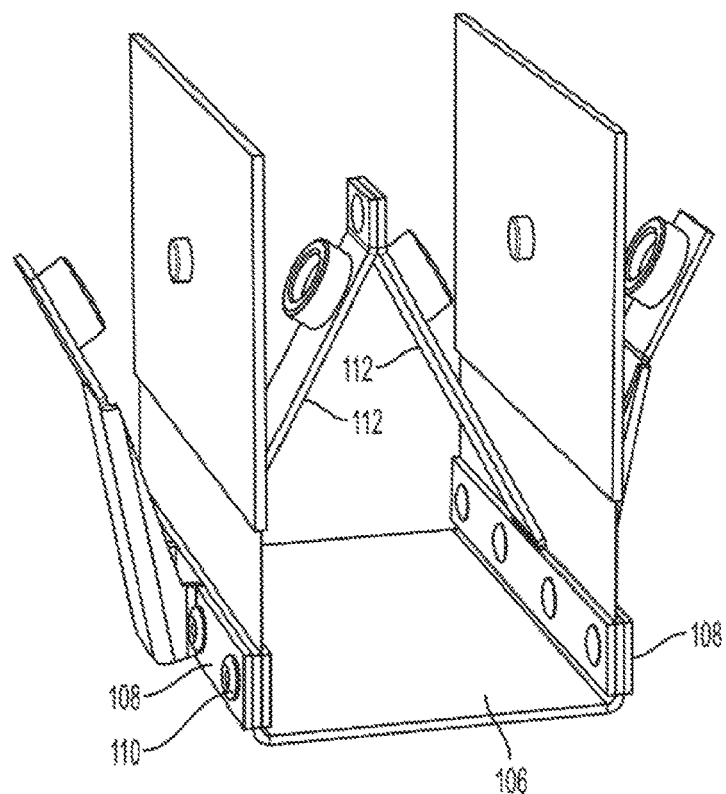
FIG. 19 illustrates one of the many cantilever fan architectures that can be used for high volume manufacturing of the present invention, where the structural components are stamped and formed.
Figure 20:
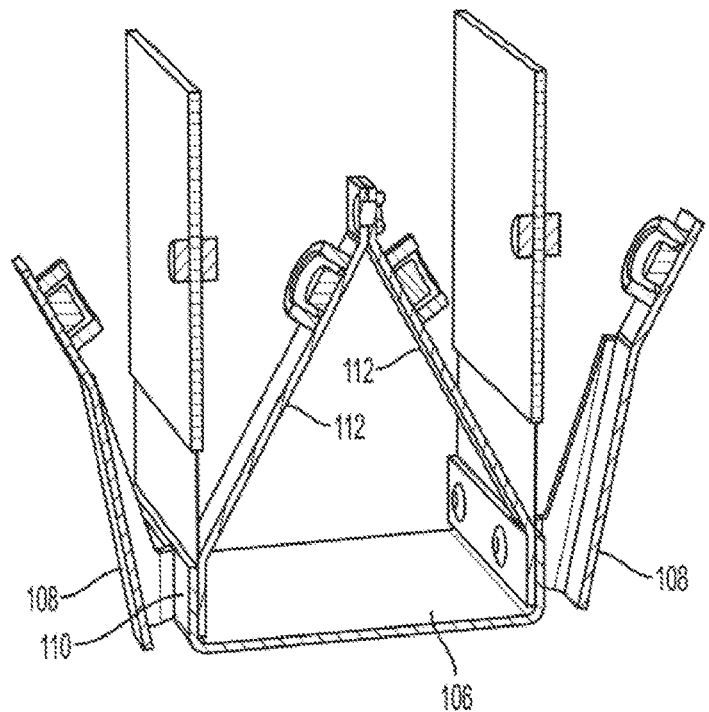
FIG. 20 provides a sectional view of the embodiment of FIG. 19.

FIG. 1 illustrates an embodiment of the present invention having a cantilever fan with magnetic springs. The cantilever fan of FIG. 1 includes a base 2, a cantilever blade 4 (hereinafter referred to as a "blade"), a blade clamp block 6, clamp block screws 8 which serve to rigidly clamp one end of blade 4 in between base 2 and clamp block 6, stationary magnets 10A and 10B rigidly attached to base 2 and blade magnets 12 being attached to blade 4. In the embodiment of FIG. 1, base 2 is preferably fabricated from a non-magnetic material such as plastic, aluminum or non-magnetic steels. Magnets 10 and 12 need not be rectangular but can be cylindrical, as shown in FIGS. 18-20, or any other geometry appropriate for a given application. FIG. 2 shows the magnetic polarities of the stationary magnets 10A and 10B and blade magnets 12 in FIG. 1, which are arranged so as to create a repulsive magnetic force between magnet 10A and blade magnets 12 and between magnet 10B and blade magnets 12. When the blade is at its center position, as shown in FIGS. 1 and 2, the two magnetic repulsive forces between magnets 10A and 12 and between magnets 10B and 12 will have the same magnitude such that these two oppositely directed forces cancel resulting in zero magnetic force on the blade. If the blade moves from the center position toward magnet 10A then the repulsive force between magnets 10A and 12 becomes larger than the repulsive force between magnets 10B and 12 and the net magnetic force on the blade is directed to the right just like the restoring force of a mechanical spring. If the blade moves from the center position toward magnet 10B then the repulsive force between magnets 10B and 12 becomes larger than the repulsive force between magnets 10A and 12 and the net magnetic force on the blade is directed to the left just like the restoring force of a mechanical spring.

Magnets that are arranged in the manner shown in FIGS. 1 and 2 can provide a restoring force that can be nonlinear with blade displacement such that the restoring force on the blade grows proportionately with displacement raised to a power greater than one. Magnetic spring nonlinearity can be reduced if desired by altering the relative orientation of the magnets as will be known to one skilled in the art. While FIG. 1 shows a pair of magnetic springs comprising magnets 10A and 12 and magnets 10B and 12, the present invention can also operate with a single magnetic spring to increase the fan's $f_o$. With a single magnetic spring, comprising for example only magnets 10A and 12 in FIG. 1, the blade's normal equilibrium or rest position will be shifted in a direction away from magnet 10A to a new position where the magnetic repulsive force equals the blades spring restoring force. In this way the blade spring is biased to a new rest position and the composite mechanical and magnetic spring stiffness will result in a higher $f_o$ than the blade alone could provide. This approach will however result in higher blade bending stresses when compared to using two magnetic springs for the same oscillating blade displacement, due to the displacement preload on the blade.

In operation, blade 4 of FIG. 1 oscillates in its fundamental cantilever mode shape when the alternating force F(t) is applied to blade 4, preferably at a frequency at or near the resonant frequency $f_o$ of the blade's mass-spring resonance, where the effective spring stiffness $K_e$ that determines $f_o$ is the sum of the blade's mechanical spring stiffness $K_{mech}$ and the magnetic spring stiffness $K_{mag}$ (i.e. $K_e=K_{mech}+K_{mag}$). The value of the blade's spring stiffness $K_{mech}$ is chosen so that the peak blade bending stress is below the blade material's fatigue limit and the value of $K_{mag}$ is chosen to provide a $K_e$ value large enough to enable operation at a $f_o$ high enough to provide the target air flow and pressure performance. Due to the use of magnetic springs, the present invention enables $K_e$ to be increased to values many times higher than $K_{mech}$ if needed to meet the air performance requirement of a given application. In summary, the present invention allows commercially relevant values of $K_e$ to be achieved, that cannot be provided by $K_{mech}$ alone, without exceeding the blade material's fatigue limit, resulting in unacceptably short blade life.

The new spring characteristics of the present invention can be exploited to provide the following unique advantages:

(1) Maximizing Air Flow Performance without Exceeding the Blade's Fatigue Limit

For a fixed blade displacement x, as $K_{mech}$ increases the blade stress increases and a value of $K_{mech}$ can be identified, referred to here as $K_{mech\text{-}limit}$, that corresponds to the blade's fatigue limit at x. Since air flow and pressure increase with $f_o$ then they increase with $K_e$. Consequently, when the present invention is designed to achieve the highest flow and pressure performance, which requires a large $K_e$ value, then typically $K_{mag}>K_{mech}$. This inequality results when high $K_e$ values are needed since $K_{mag}$ can be increased without increasing stress, while $K_{mech}$ must not exceed $K_{mech\text{-}limit}$.

(2) Maximizing the Stress Safety Factor

The stress safety factor is defined here as the ratio $\sigma_{FL}/\sigma_{PB}$, where $\sigma_{FL}$ is the fatigue limit stress and $\sigma_{PB}$ is the peak bending stress for the blade's peak operating displacement x. For fixed x, bending stress increases with $K_{mech}$, so for the highest stress safety factor, $K_{mech}$ should be as small as possible and then $K_{mag}$ is adjusted to achieve the desired value of $K_e$. For a given target value of $K_e$, the addition of a magnetic spring will always enable a higher blade stress safety factor, compared to the blade alone, regardless of the absolute value of $K_e$.

Spring magnets that are arranged with the polarities shown in FIG. 2 will typically exhibit a nonlinear spring behavior and in such cases where $K_{mag}$ is also the dominant spring stiffness, the effective spring stiffness $K_e$ will be nonlinear which will cause $f_o$ to increase with the blade's oscillating displacement amplitude. As is well known in the art, an electronic drive circuit can be provided with a resonance lock control that will lock the drive frequency to the changing $f_o$ value, in which case an increase in drive force will result in both increased blade displacement and a higher $f_o$. The $f_o$ dependence on blade displacement provides an advantage of lower noise at lower air flow rates resulting from both reduced blade displacement and reduced operating frequency.

The position of blade magnets 12 on blade 4 and the corresponding position of the stationary magnets 10A and 10B in FIGS. 1 and 2 can in general be at any point along the length of blade 4. In general, blade magnets can be placed at the so called "center of oscillation" so as to minimize excitation of the blade's higher vibrational modes.

Blade Stress Reduction

The following example is given to illustrate how the magnetic springs of the present invention make significant and surprising reductions in blade stress while enabling the higher $f_o$ range needed for commercially relevant air performance and fan size.

In actual cantilever fans with short blade lengths, mass must be added to the cantilever blade to provide stable operation of the blade, thereby eliminating higher blade vibrational modes which create commercially unacceptable noise levels and also introduce increased stresses that can further shorten blade life. Mass must also be added to the blade as part of the motor assembly in order to deliver adequate driving force to the blade to achieve the required oscillating stroke. This additional blade mass will of course reduce $f_o$ which, for a conventional cantilever fan, requires additional blade spring stiffness to achieve the target $f_o$ compared to a blade with no added mass. For example, to enable a conventional cantilever fan to fit in a high bay LED lamp and provide the required air pressure and air flow rate, the blade can be no longer than 30 mm and must run at 100 Hz with an oscillating blade tip displacement of 32 mm peak-to-peak. To meet these requirements, a 30 mm long blade made of flapper valve steel must be 0.15 mm thick to provide a spring K high enough for the required 100 Hz operation with the added blade mass described above. This operating condition will result in peak blade bending stresses of 894 MPa, but a typical flapper valve steel fatigue limit is only 710 MPa. Consequently the blade will fail in less than $10^6$ cycles, which at 100 Hz will occur in less than 2.8 hours.

Testing of cantilever fan designs similar to FIG. 1 have demonstrated an 8× increase in $f_o$ as calculated by dividing the measured $f_o$ with the stationary magnets installed by the measured $f_o$ with the stationary magnets removed. By adding magnetic springs to the conventional 100 Hz cantilever fan described above, the thickness of the blade can be substantially reduced, thereby reducing the blade stress. An 8× reduction in $f_o$ corresponds to a 64× reduction in the blade's mechanical spring stiffness $K_{mech}$, according to $f_o=1/(2\pi)(K/m)^{1/2}$. A 64× reduction in K corresponds to a 4× reduction in peak bending stress, thereby reducing the bending stress from 894 MPa to 223.5 MPa and providing a fatigue limit safety factor of 710 MPa/223.5 Mpa=3.2.

In summary, by using magnetic springs that provide the dominant spring stiffness of the cantilever fan, commercially relevant air performance can be delivered while at the same time the cantilever blade thickness can be reduced to the point where its peak bending stress is below the blade material's fatigue limit, thereby providing infinite blade life. This design example with fatigue limit safety factors as high as 3.2 illustrates the present invention's ability to operate at frequencies much higher than 100 Hz and/or with much shorter blades with commercially relevant air performance while still offering acceptable stress safety factors and infinite blade life. When using the magnetic springs of the present invention as indicated by $K_e>K_{mech}$, any blade thickness that maintains blade bending stress below the blade's fatigue limit, at the target blade displacement, is considered within the scope of the present invention.

Blade Actuation

The cantilever fan embodiment of FIG. 1 can be actuated with many different motor types including variable reluctance, voice-coil moving-magnet, voice-coil moving-coil and electrostrictive materials. Actuation forces can be applied at any number of points along the length of the blade (referred to as "blade driving") or can be applied to the clamp (referred to as "clamp driving"). Regardless of the motor type, magnetic springs can be used to provide the air performance, fan size and extended life advantages of the present invention.

Figure 3:
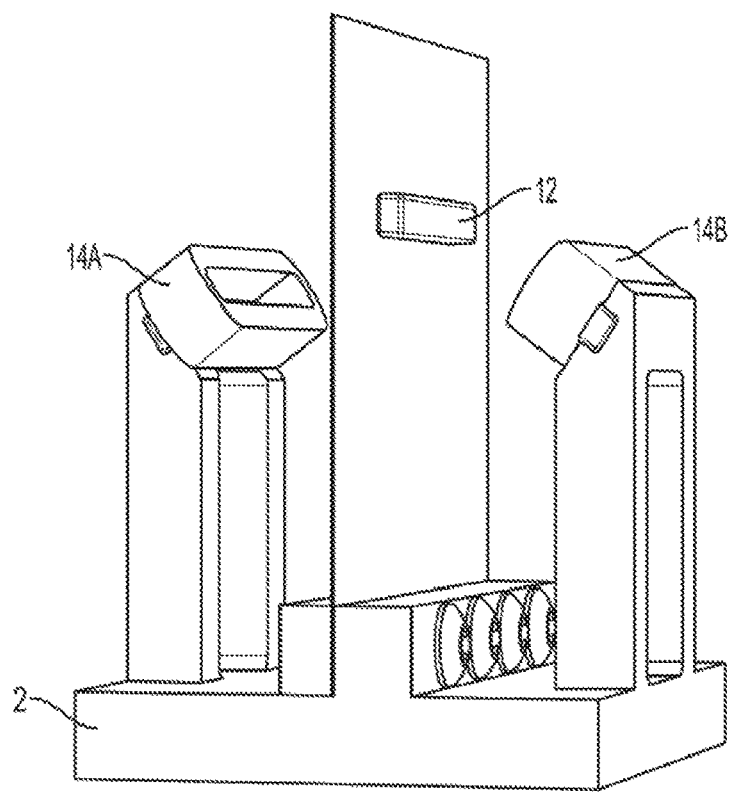
FIG. 3 adds coils to the cantilever fan of FIG. 1 thereby providing a voice-coil moving-magnet motor.
Figure 4:
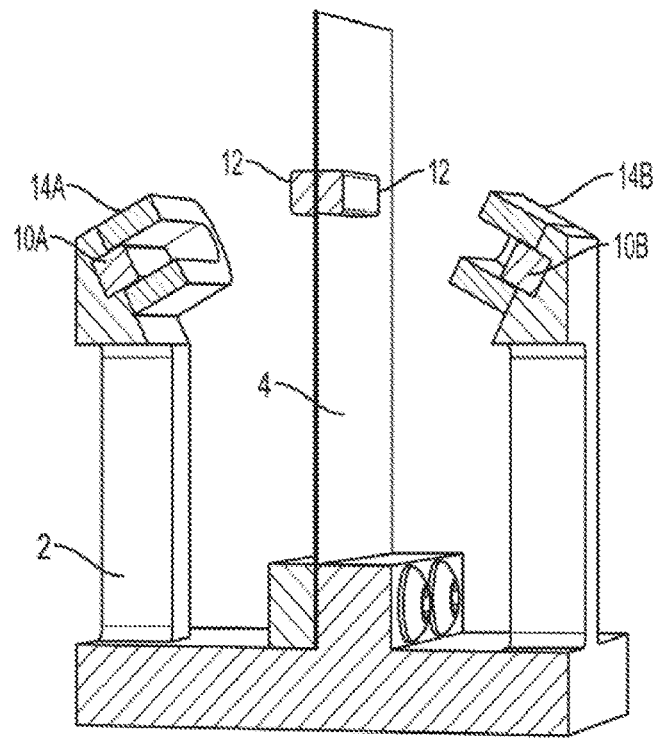
FIG. 4 provides a sectional view of the embodiment of FIG. 3.
Figure 5:
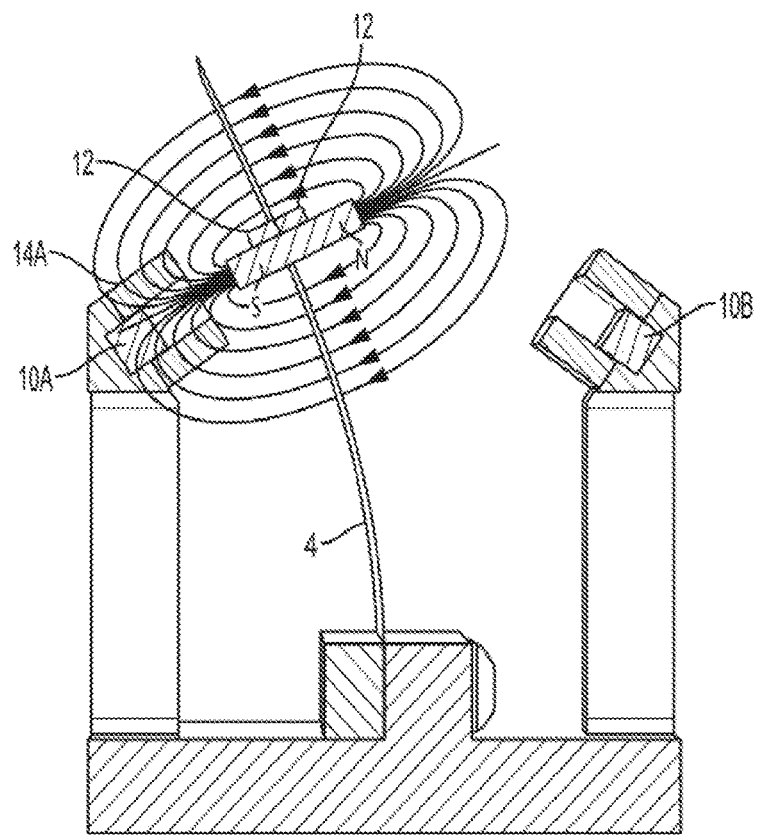
FIG. 5 is a sectional view of the embodiment of FIG. 3, which illustrates the magnetic flux lines of the blade's permanent magnets during blade deflection.

FIGS. 3, 4 and 5 illustrate a voice-coil moving-magnet type motor used in combination with the embodiment of FIG. 1, comprising coils 14A and 14B being coaxially co-located with respective stationary magnets 10A and 10B and rigidly connected to base 2. In operation, coils 14 are energized with a periodic current waveform which interacts with the magnetic field of blade magnets 12 resulting in a periodic Lorentz force being exerted between coils 14 and blade magnets 12, thereby causing blade 4 to oscillate in response to the periodic Lorentz force at the frequency of the periodic current. The periodic current may be, for example, a bipolar sinusoidal waveform, a unipolar half-sine waveform or any number of other periodic bipolar or unipolar current waveforms such as triangular, square, trapezoidal or other as determined by the requirements of a particular design. As shown in FIG. 5 and as explained in connection with Figures 1and 2, as blade 4 approaches coil 14A, the restoring magnetic spring force between blade magnets 12 and stationary magnet 10A is increasing and in combination with the mechanical restoring force of blade 4, provides the effective spring stiffness $K_e$ that determines the fan's resonant frequency $f_o$. To maximize the fan's efficiency, the frequency of the alternating current in coils 14 should be close to or equal to the cantilever blade's resonant frequency $f_o$ corresponding to its displacement amplitude. The electrical polarity of each coil is chosen such that their respective Lorentz forces exerted on blade 4 will add constructively, thereby always applying their respective forces to the blade in the same direction.

FIG. 5, shows how the geometrical relationship between the magnetic field of blade magnets 12 and coil 14A meet the requirements for creating a Lorentz force in the direction of the blade's displacement. One skilled in the art will understand how to improve the motor efficiency, for example by using high magnetic permeability material around the coil and/or the blade magnets to maximize the permanent magnet's field strength and field direction as it crosses the coil, thereby creating the largest and properly directed Lorentz force for the applied current. However, care must be taken when optimizing the motor to not undesirably alter the magnetic spring properties. While the motor design shown in FIG. 3 provides two coils, the present invention can operate with only one coil in which case higher currents would be needed to achieve the same blade displacement as achieved with two coils.

Figure 9:
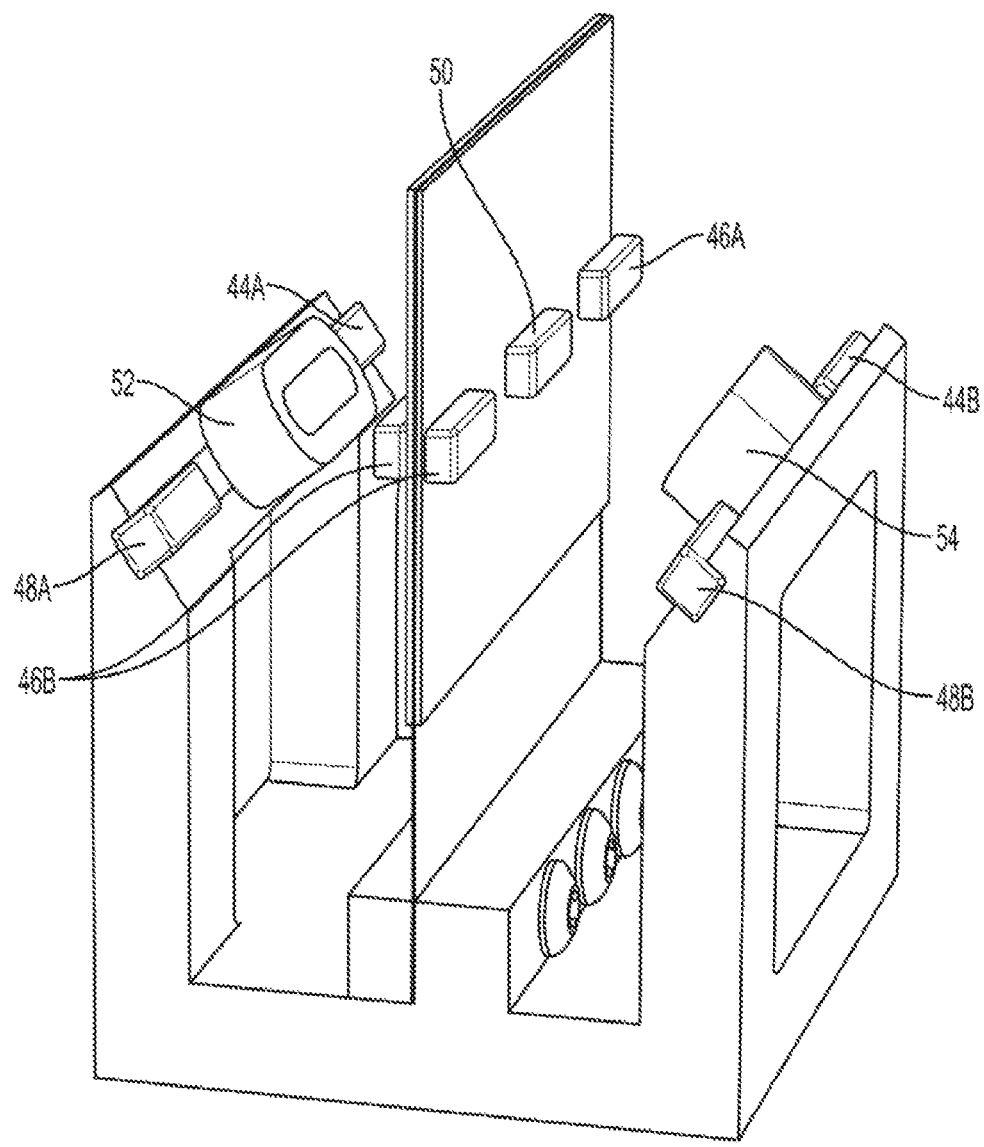
FIG. 9 provides an embodiment of the present invention where the motor magnets and magnetic spring magnets are located separately.
Figure 10:
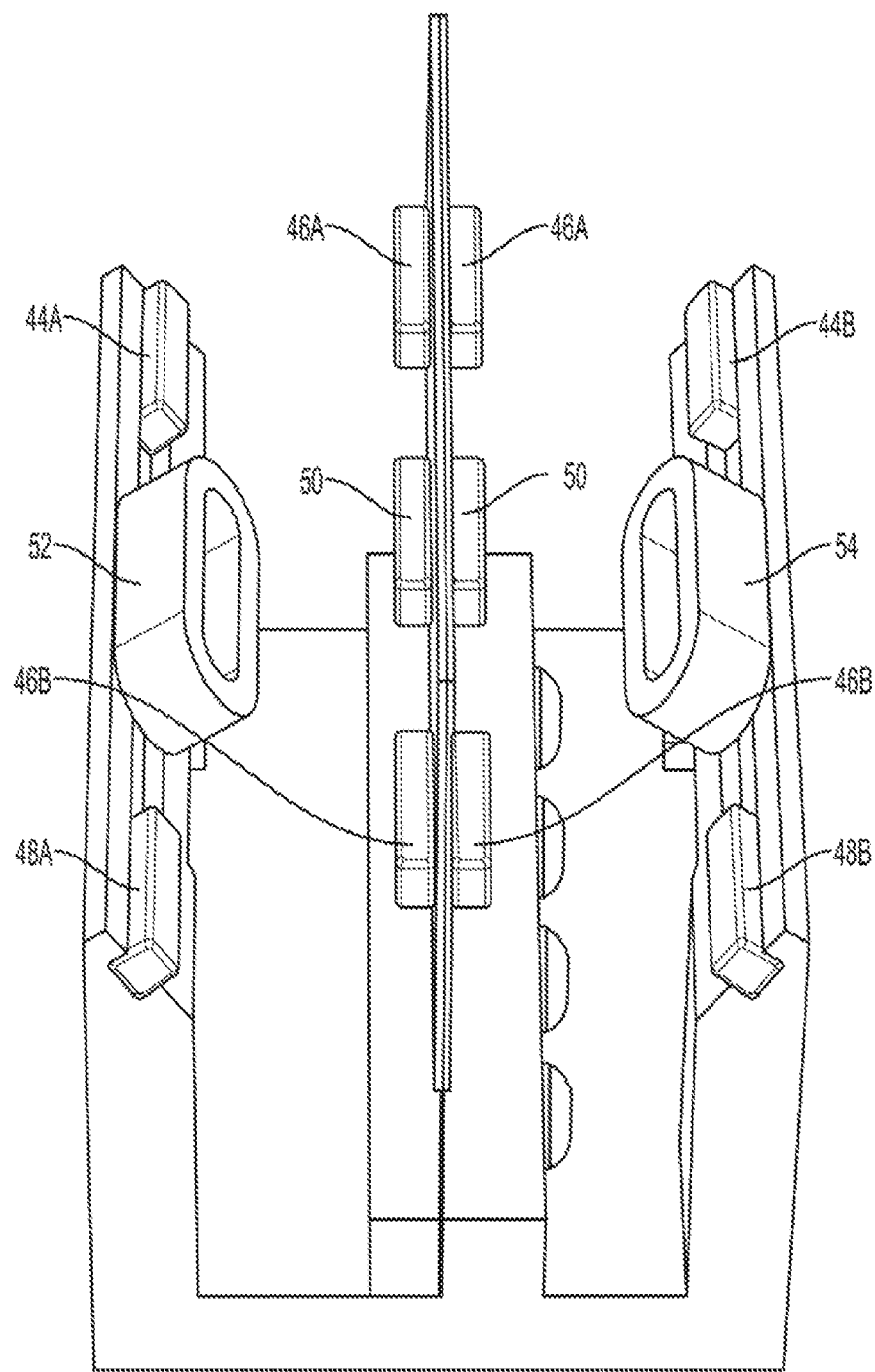
FIG. 10 provides another view of the embodiment of FIG. 9.

In the motor design of FIGS. 3-5, the magnetic spring and the motor coil are coaxially co-located. As shown in FIGS. 9 and 10 the motor components and magnetic spring components can also be located separately. In FIG. 9, there are two pairs of magnetic springs with the first pair consisting of blade magnets 46A and stationary magnets 44A and 44B and a second pair consisting of blade magnets 46B and stationary magnets 48A and 48B. The motor components consist of coils 52 and 54 and blade magnets 50. The motor operates according to the same principles as described for FIGS. 3-5 except that there is no magnet located within coils 52 and 54 and consequently there is no magnet spring force associated with magnets 50. FIG. 10 provides another perspective view of the embodiment of FIG. 9. The magnetic springs FIG. 9 operate according to the same principles as described for FIGS. 1 and 2.

Figure 17:
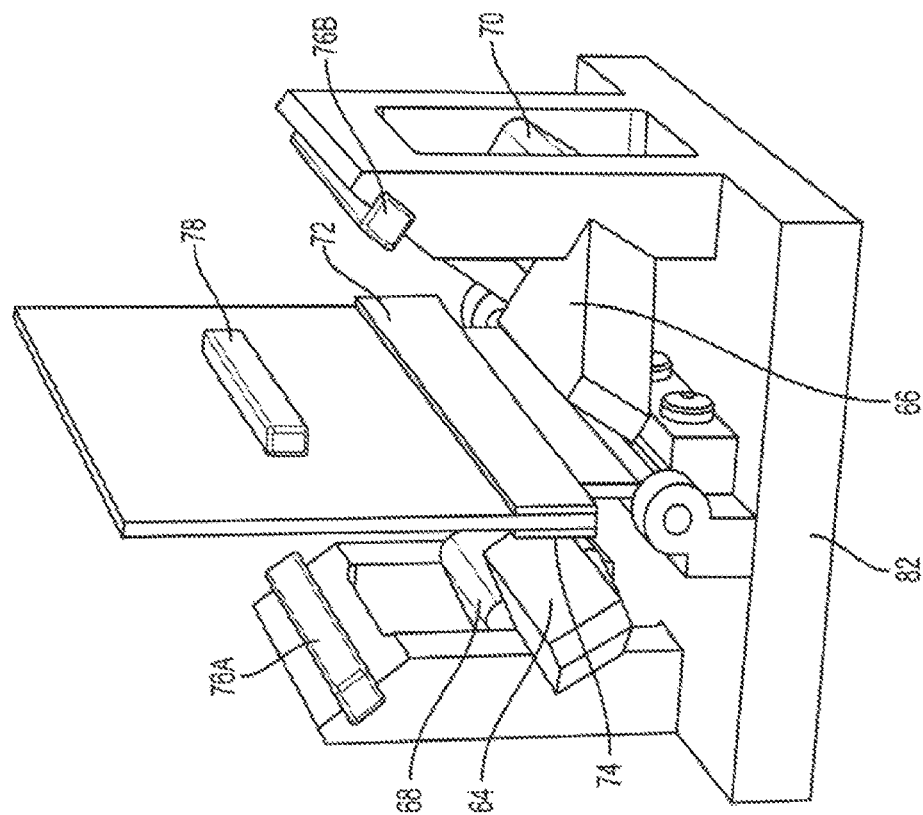
FIG. 17 illustrates one of many ways that a variable reluctance motor can be used to drive a cantilever fan having magnetic springs.
Figure 17:
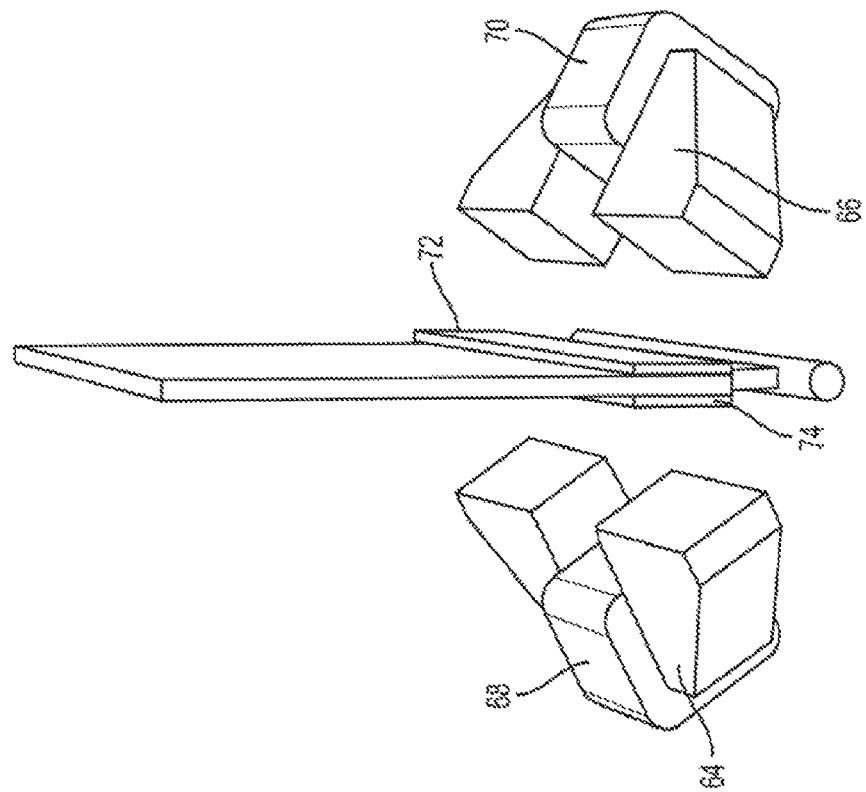

FIG. 17, illustrates one possible approach for using a variable reluctance motor in combination with the present invention. The motor section consists of stators 64 and 66 rigidly attached to base 82, coils 68 and 70 wound around respective stators 64 and 66, armatures 72 and 74 rigidly attached to blade 80. The magnetic spring consist of stationary magnets 76A and 76B and blade magnets 78. In operation, the coils are energized alternately with only one coil being energized at a time. For example, when coil 68 is energized with a current, then the magnetic field between stator 64 and armature 74 creates an attractive force that pulls blade 80 towards stator 64. When armature 74 has reached a predetermined distance from stator 64, the current in coil 68 is turned off and the current in coil 70 is turned on and the resulting magnetic field between stator 66 and armature 72 creates an attractive force that pulls blade 80 towards stator 66. The coils will preferably be actuated at a frequency at or near the $f_o$ created by the magnetic springs 76A, 76B and 78.

Magnetic Spring Variations

The stiffness and nonlinearity of magnetic springs can be varied by changing the sizes and/or relative sizes of the stationary magnets and blade magnets, the degree of magnetization of the magnets, the number of magnets, the location of the magnets and also by changing the relative orientation and/or alignment of the magnets. The following examples provide illustrations of typical variations.

If appropriate for a given application, the number of magnets required for either the motor or the magnetic springs can be reduced by routing a magnet's field to the remote points where needed via magnetic circuits comprising a magnet combines with high magnetic permeability materials such as steel. The design of magnetic circuits is well known in the art.

The magnetic springs described in Figures 1and 2 are passive since the repulsive magnetic fields are provided solely by the permanent magnets. The magnetic springs of the current invention can also be active and provide the same advantages. For the embodiment shown in FIGS. 3 and 4, the periodic current in motor coils 14A and 14B serve to create the oscillating Lorentz force needed to drive the blade. Coils 14A and 14B can also be used to create the magnetic spring force in which case stationary magnets 10A and 10B are removed and the periodic current waveforms used to energize coils 14A and 14B and oscillate the blade will have an added DC component. The magnetic field polarity associated with the DC current component creates a repulsive force between coil 14A and blade magnet 12 and between coil 14B and blade magnet 12, which is the same magnetic spring condition created by stationary magnets 10A and 10B. In this case, two of the "passive" magnets of the magnetic spring are replaced with the "active" DC magnetic field of the coil. When using the coils as part of the magnetic spring, the stiffness of the magnetic spring, and therefore the operating frequency $f_o$, can be controlled by varying the DC current amplitude. When the stationary magnets are in place as shown in FIG. 3, the coils can still be used to increase or decrease the magnetic spring stiffness between the stationary magnets 10A and 10B and blade magnet 12 by introducing a DC current to the coils and by varying current amplitude and polarity of the DC current. Depending on the polarity of the DC current, its magnetic field will either add to or subtract from the field of its respective stationary magnet. The same approach can be used when the motor coil is not co-located with the magnetic spring components, as shown for example in FIGS. 9 and 10, by adding a coil to the location of the magnetic springs.

Figure 11:
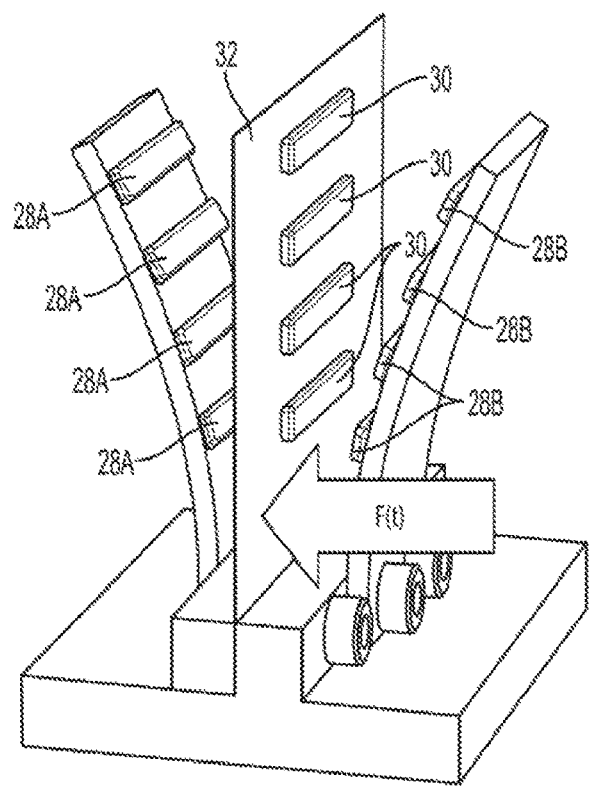
FIG. 11 shows a further magnetic spring embodiment where multiple magnetic springs are distributed along the length of the blade.

FIG. 11 shows an embodiment of the present invention using four sets of magnet springs comprising stationary springs 28A and 28B and blade springs 30, where the magnetic springs are distributed along the length of the blade 32. This approach distributes the spring restoring force along the length of the blade.

Figure 12:
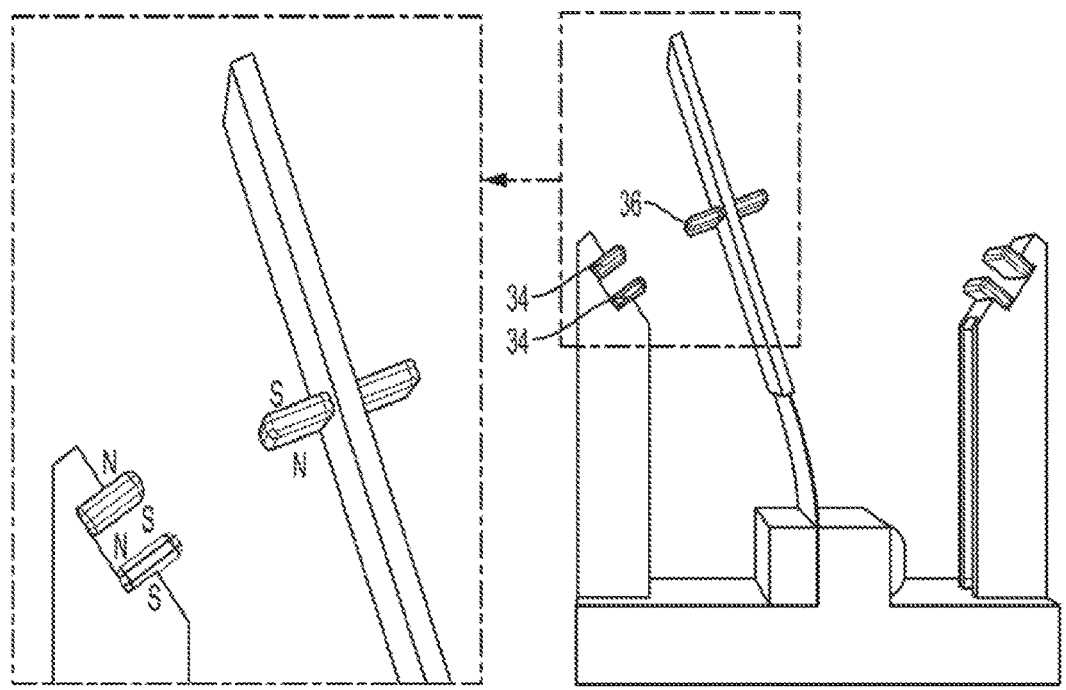
FIG. 12 illustrates a magnetic spring embodiment of the present invention using one of many possible magnet orientations.

In FIGS. 1-11, the permanent magnets forming the magnetic springs, all have a magnetic polarity in the direction of the blade's displacement. FIG. 12 illustrates one of many different magnet spring orientations that can be used for the present invention where stationary magnets 34 and blade magnets 36 have a magnetic polarity being transverse to the blade's displacement direction. In FIG. 12 the polarity of stationary magnets 34 creates a field between magnets 34 having a polarity that is opposite that of blade magnets 36, resulting in a repulsive force between magnets 34 and 36. The embodiment of FIG. 12 shows a pair of stationary magnets on each side of the blade. However, one of the magnets of each pair could be removed and a magnetic spring restoring force will still be provided. However, using only a single stationary magnet in the orientation of FIG. 12 will result in larger components of the restoring force that are transverse to the blade's displacement direction, which can lead to the excitation of unwanted higher vibrational modes.

Figure 13:
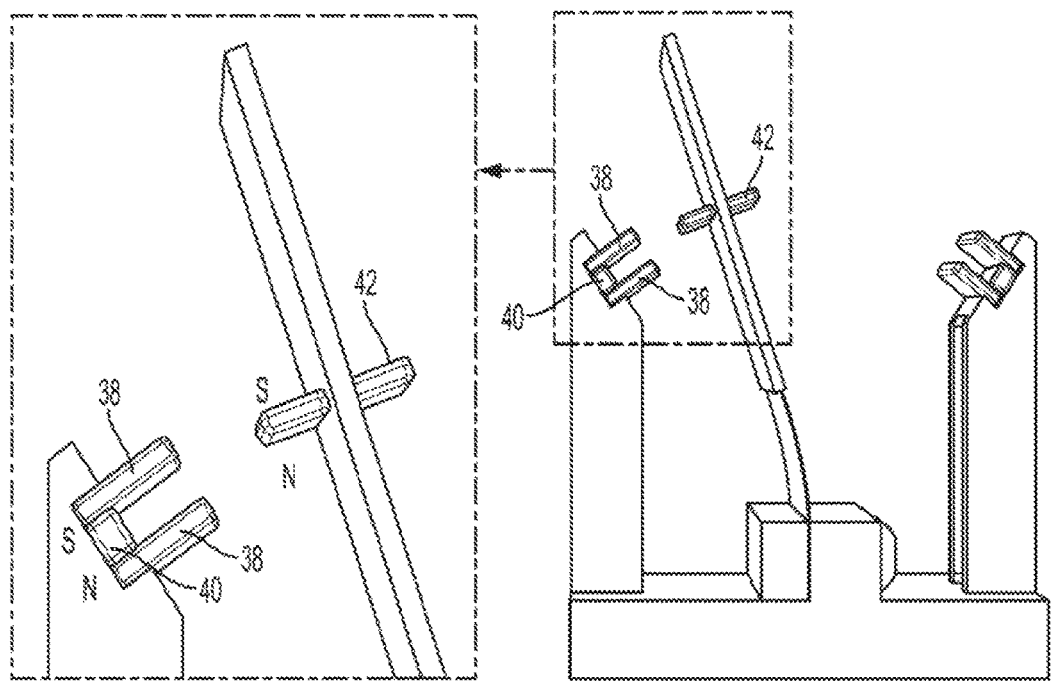
FIG. 13 illustrates a further magnetic spring embodiment of the present invention using one of many possible magnet orientations.

FIG. 13 shows another embodiment also having magnet polarities that are transverse to the blade's direction of displacement. In FIG. 13 a stationary magnet 40 is sandwiched between two plates of high magnetic permeability material 38 whereby the magnetic field between plates 38 has a polarity opposite to blade magnets 42 resulting in a repulsive force between magnets 40 and 42.

FIG. 18 provides one example of the many magnet shapes that can be used with the present invention. The embodiment of FIG. 18 consists of cylindrical stationary magnets 56A and 56B, cylindrical blade magnets 58 and motor coils 60 and 62. The embodiment of FIG. 18 operates in the same manner as described for the embodiment of FIG. 3.

Minimizing Attractive Forces

Figure 6:
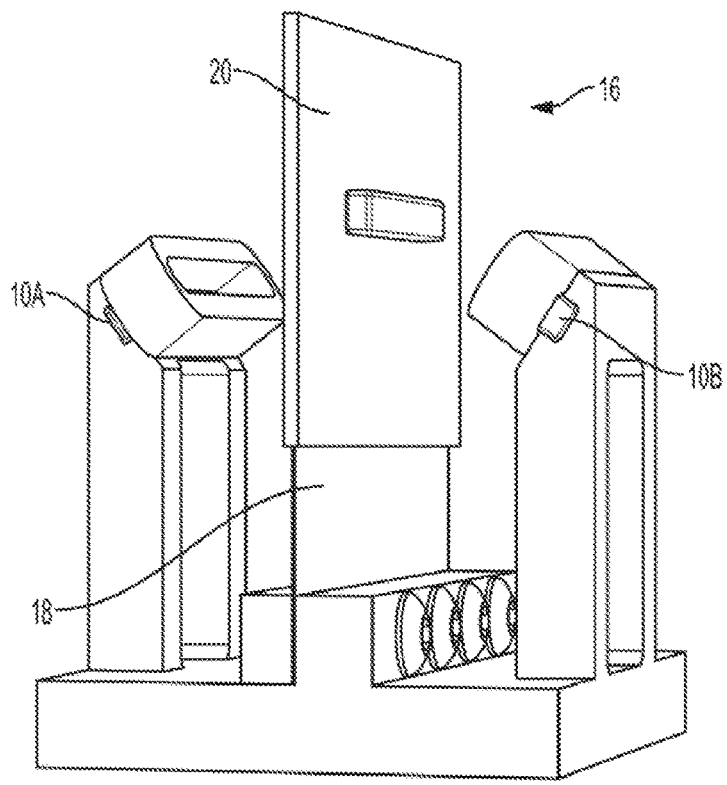
FIG. 6 shows a blade having a bending section and a rigid section.
Figure 7:
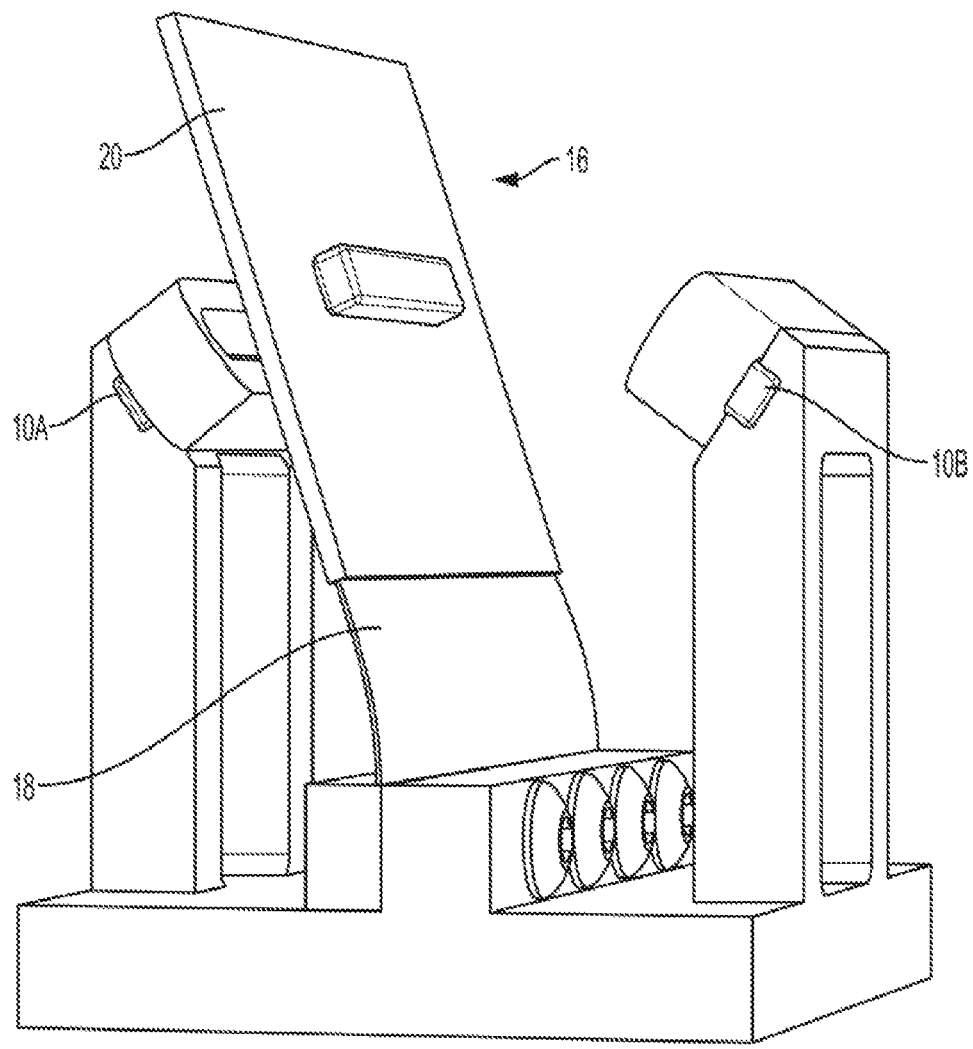
FIG. 7 illustrates the deflection of the blade of FIG. 6.

Many metals with high fatigue strength are also magnetic. When a one-piece blade, as shown in FIG. 1, is made of a magnetic metal, then an attractive force will exist between the blade and the stationary magnets 10 and this attractive force will of course increase as the given blade-to-magnet distance decreases. The superposition of this attractive force with the repulsive force between magnets 10 and 12, will result in a reduced repulsive force and consequently a lower magnetic spring K and lower resulting $f_o$. The blade design of FIG. 6 can be used to minimize these unwanted attractive forces. FIG. 6 provides another embodiment of the present invention having a blade 16 comprising a bending section 18 and a planar paddle section 20 which does not bend. As shown in FIG. 7, blade 16 is able to deflect due to the bending of section 18 while paddle section 20 remains primarily straight or planar. In this way, the bending section 18 acts similarly to a hinge for paddle section 20. This blade design allows paddle section 20 to be made from a non magnetic material such as plastic, thereby minimizing the unwanted attractive forces between the blade and stationary magnets 10.

Vibration Cancelation

Figure 8:
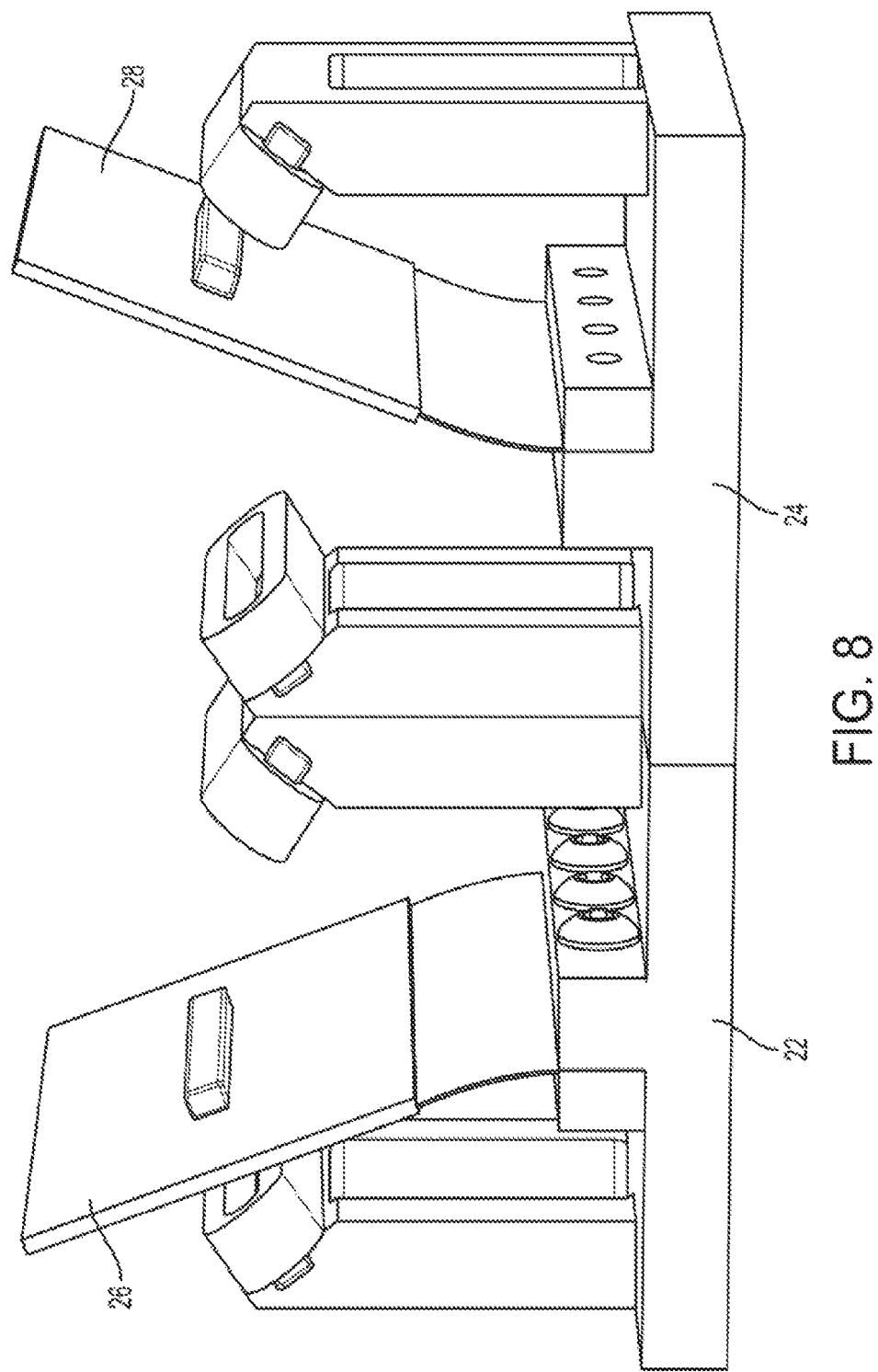
FIG. 8 illustrates a two-blade embodiment of the present invention for minimizing transverse vibrations of the fan assembly.

FIG. 8 provides an embodiment where the base 22 and the base 24 of two single-blade cantilever fan assemblies of the present invention are rigidly connected, thereby forming a single base. The displacement oscillations of blades 26 and 28 are 180° out of phase resulting in a degree of cancelation of the transverse reaction forces exerted on base 22-24 by blades 26 and 28, wherein transverse vibrations of the fan assembly are minimized.

Blade Mounting Variations

In FIGS. 1-13 all blades are clamped to a base which requires these blades to oscillate in a bending mode. Other embodiments of the present invention include variations in blade mounting in combination with magnetic springs.

Figure 14:
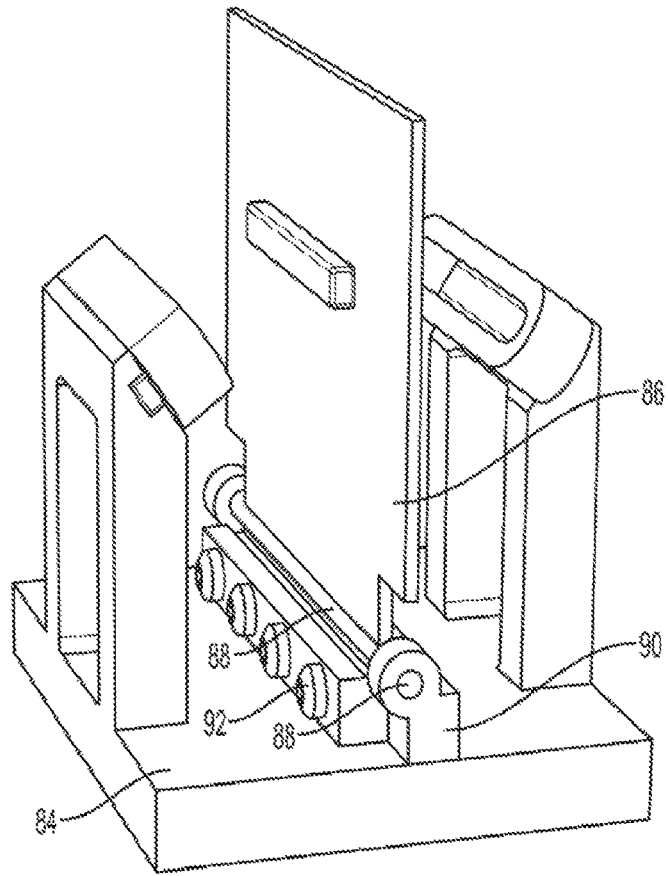
FIG. 14 illustrates the substitution of the blade's bending section with a mechanical hinge.
Figure 15:
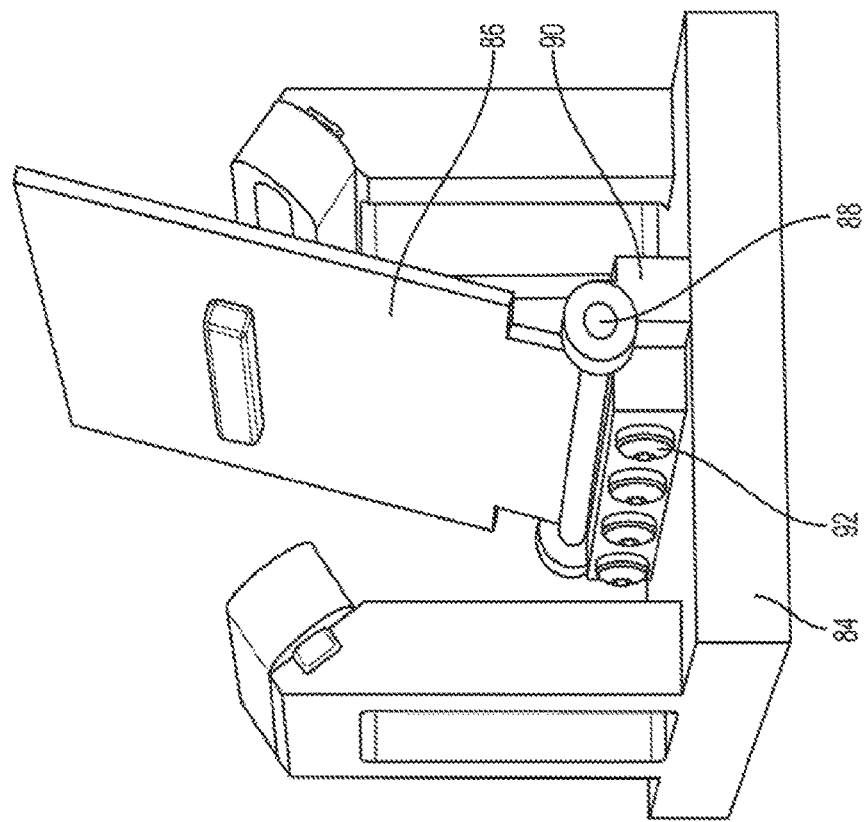
FIG. 15 provides another view of the embodiment of FIG. 15 showing the blade's deflection.

FIG. 14, provides an example of other ways to mount a fan blade in combination with magnetic springs consisting of base 84, a blade 86 having a mounting shaft 88, a sleeve bearing or passive magnetic bearing 90 rigidly attached to base 84 by screws 92 whereby bearing 90 receives mounting shaft 88 allowing mounting shaft 88 to spin within bearing 90. In operation, blade 86 oscillates by pivoting about the axis of shaft 88 as illustrated in FIG. 15. The magnetic springs and motor work exactly as described for the embodiment of FIG. 3.

Figure 16:
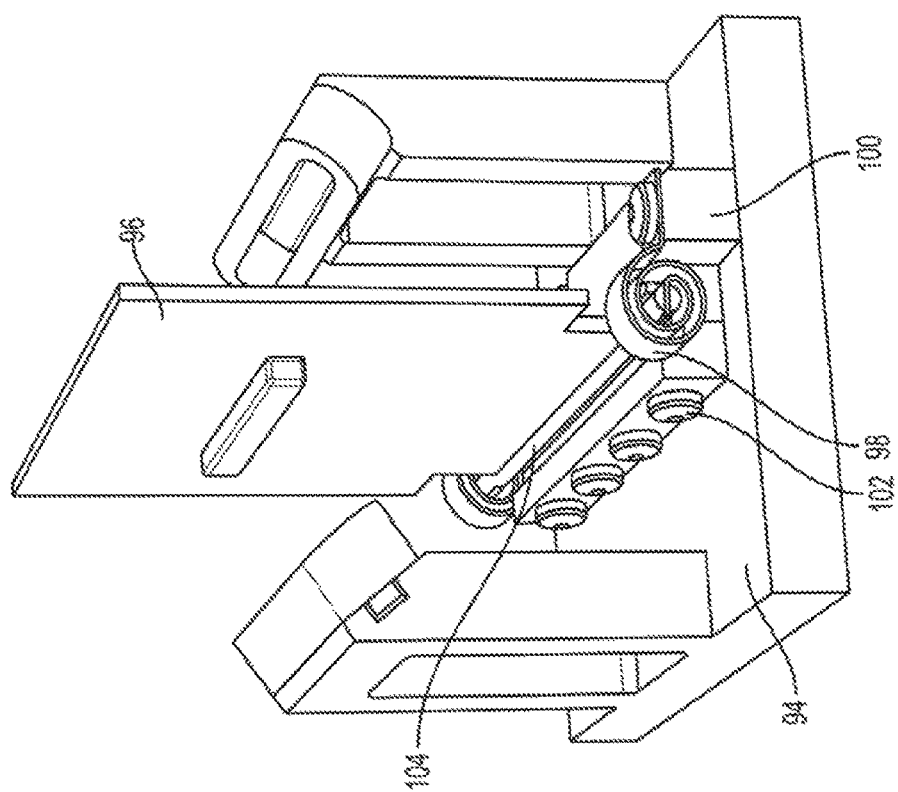
FIG. 16 shows the substitution of the blade's bending section with a coil spring.

FIG. 16, provides a further example of other ways to mount a fan blade in combination with magnetic springs consisting of a base 94, a spring retainer 100 rigidly mounted to base 94 with screws 102, a blade 96 having a mounting shaft 104, a coil spring 98 with one end being rigidly mounted to shaft 104 and the other end rigidly mounted to spring retainer 100. In operation, the spring 98 allows the blade to pivot about shaft 88 as it oscillates. Many different springs designs other than a coil spring could be used to replace spring 98 as is known in the art. The magnetic springs and motor of FIG. 16 work exactly as described for the embodiment of FIG. 3.

Fabrication

The architectures illustrated in FIGS. 1-18 are intended to clearly illustrate the principles of the present invention and are not intended for high volume manufacturing. Many high volume manufacturing methods can be used for the present invention and are well known in the art. For example, FIGS. 19 and 20 show a double blade embodiment of the present invention made using the processes of stamping and forming which is a low cost manufacturing process that can be used to achieve production fast cycle times. The embodiment of FIG. 19 consists of a stamped formed base 106, stamped formed outer coil arms 108 being rigidly attached to base 106 with rivets 110, stamped formed inner coil arms 112 being rigidly attached to base 106 with rivets 110. FIG. 20 provides a cross section of the embodiment of FIG. 19 to show further detail of the stamped formed subcomponents. The magnetic springs and motor work exactly as described for the embodiment of FIG. 3.

The foregoing descriptions of some of the embodiments of the present invention have been presented for purposes of illustration and description. The embodiments provided herein are not intended to be exhaustive or to limit the invention to a precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. Embodiments and improvements include for example blade geometries and blade materials to improve dynamic stability and maximize air performance, both axial and radial flow cantilever fans, the use of two or more blades in a single fan for improved performance and vibration cancelation, motor types and motor topologies, drives circuits with resonance lock controls and variable air flow rate controls and markets and applications for the present invention including for example general electronics cooling, automotive, home appliances, consumer electronics, avionics and military applications. Many examples of such embodiments and modifications can be seen in U.S. patent application No. 61/376,858 which is incorporated by reference herein. Although the above description contains many specifications, these should not be construed as limitations on the scope of the invention, but rather as an exemplification of alternative embodiments thereof.

What is claimed is:

1. A cantilever fan, comprising:
a blade connected at one end to a base and having a distal end which is free to oscillate with distal end having the largest swept displacement of any portion of the blade;
wherein the blade has a length that extends from the one end to the distal end;
a blade permanent magnet attached only to the blade at a point along the blade's length, wherein the permanent magnet is free to move with the blade;
a stationary permanent magnet attached only to the base;
wherein the respective locations and relative orientation of the blade permanent magnet and stationary magnet result in a repulsive magnetic force between the blade permanent magnet and stationary magnet and wherein the repulsive force increases as the blade's deflection brings the blade permanent magnet closer to the stationary magnet; and
a motor that applies a periodic force to the blade.

2. The cantilever fan of claim 1 wherein the motor causes the blade to oscillate at the frequency of the periodic force.

3. The cantilever fan of claim 2 further comprising:
the frequency of the periodic force being equal to or near to a preferred resonant frequency of the cantilever blade.

4. The cantilever fan of claim 2 wherein the motor further comprises:
a current carrying coil being coaxially co-located with the stationary magnet, wherein a periodic current within the coil creates the periodic force on the blade.

5. The cantilever fan of claim 1, further comprising:
the blade's material being a ferrous metal and the blade's peak bending stress during oscillation being less than the fatigue limit of the ferrous metal.

6. The cantilever fan of claim 1, wherein the one end of the blade is clamped to the base.

7. The cantilever fan of claim 6, further comprising:
the blade having a bending section that extends from the clamped one end to an intermediate point along the blade's length;
the blade having a planar section that extends from the intermediate point to the distal end of the blade;
the blade permanent magnets being attached to the planar section.

8. The cantilever fan of claim 7, further comprising:
the planar section being made of a non-magnetic material.

9. A cantilever fan comprising:
a blade extending between a first end and a distal end,
a motor that applies a periodic force to the blade;
a base, wherein the first end of the blade is connected to the base and the distal end is free to oscillate with the distal end having the largest swept displacement of any portion of the blade;
a magnet attached to the blade; wherein the magnet is configured to oscillate with the blade;
a stationary permanent magnet attached to the base;
wherein the magnets are positioned so that a repulsive magnetic force exists between the oscillating magnet and the stationary magnet and wherein the repulsive magnet force increases as the blade's deflection brings the oscillating magnet closer to the stationary magnet.

10. The cantilever fan of claim 9, further comprising a spring connected to the first end of the blade and the base.

11. The cantilever fan of claim 10, wherein the spring is a coiled spring.

12. The cantilever fan of claim 10, wherein the spring comprises a plurality of springs.

13. The cantilever fan of claim 12, wherein at least two of the plurality of springs are connected to opposite sides of the first end of the blade.

14. The cantilever fan of claim 9, wherein the motor includes a current carrying coil co-located with the stationary magnet.

15. The cantilever fan of claim 9, wherein the stationary magnet comprises a pair of stationary magnets located on opposite sides of the blade; and wherein the oscillating magnet attached to the blade comprises a pair of oscillating magnets located on opposite sides of the blade so that each of the oscillating magnets creates a repulsive force with one of the stationary magnets located on the same side of the blade as the oscillating magnet.

16. The cantilever fan of claim 15, wherein the motor includes a pair of current carrying coils, wherein each of the pair current carrying coils are co-located with each of the pair of stationary magnets.

17. The cantilever fan of claim 9, wherein the motor is a variable reluctance motor, wherein the variable reluctance motor comprises:
a stator mounted to the base;
an armature mounted to the blade;
a current carrying coil wound around the stator;
wherein the coil is periodically energized to thereby create an attractive force between the stator and the armature.

18. A fan for moving air comprising:
a blade extending between a mounted end and a free end,
a base, wherein the mounted end of the blade is connected to the base by a spring and the free end of the blade is configured to oscillate;
a motor that applies a force to the blade that causes the free end of the blade to oscillate;
a magnetic spring comprising:
a first magnet attached to the blade;
a second magnet attached to the base, wherein the second magnet is a permanent magnet;
wherein the first and second magnets are positioned so that a repulsive magnetic force exists between the first magnet and the second magnet and wherein the repulsive magnetic force increases as the blade's oscillation brings the first magnet closer to the second magnet.

19. The fan of claim 18, wherein the spring comprises a plurality of coil springs.

20. The fan of claim 19, wherein the motor includes a current carrying coil co-located with the second magnet, wherein the current carrying coil is configured to carry a current having a periodic wave form to create a periodic force against the blade to thereby cause the blade to oscillate.

* * * * *